US00RE40661E

(19) United States
(12) Reissued Patent
Park et al.

(10) Patent Number: US RE40,661 E
(45) Date of Reissued Patent: Mar. 10, 2009

(54) ERROR PREVENTION METHOD FOR MULTIMEDIA DATA

(75) Inventors: Dong-seek Park, Suwon-si (KR); John Villasenor, Santa Monica, CA (US); Feng Chen, Irvine, CA (US); Max Luttrell, Venice, CA (US); Brendan Dowling, Malibu, CA (US)

(73) Assignees: Samsung Electronics Co., Ltd., Suwon-si (KR); Regents of the University of California, Oakland, CA (US)

(21) Appl. No.: 09/996,086
(22) Filed: Sep. 21, 2001
(Under 37 CFR 1.47)

Related U.S. Patent Documents

Reissue of:
(64) Patent No.: 5,954,839
Issued: Sep. 21, 1999
Appl. No.: 08/782,174
Filed: Jan. 14, 1997

(51) Int. Cl.
*G06F 11/00* (2006.01)

(52) U.S. Cl. ..... 714/825; 714/775; 714/746; 714/748; 714/751; 375/364; 375/368

(58) Field of Classification Search ..... 65/32.5; 357/206; 364/514; 714/755, 799, 699, 825, 714/775, 746, 748, 751
See application file for complete search history.

(56) References Cited

U.S. PATENT DOCUMENTS

| | | | | | |
|---|---|---|---|---|---|
| 4,914,699 | A | * | 4/1990 | Dunn et al. | 65/32.5 |
| 5,157,687 | A | * | 10/1992 | Tymes | 357/206 |
| 5,487,068 | A | | 1/1996 | Smolinske et al. | |
| 5,671,156 | A | * | 9/1997 | Weerackody et al. | 364/514 |
| 5,689,439 | A | * | 11/1997 | Weerackody et al. | 364/514 |
| 6,012,159 | A | * | 1/2000 | Fischer et al. | 714/755 |
| 6,216,250 | B1 | * | 4/2001 | Williams | 714/799 |

FOREIGN PATENT DOCUMENTS

| | | | |
|---|---|---|---|
| EP | 0 479 296 | A1 * | 4/1992 |
| EP | 0735701 | A2 | 2/1996 |
| JP | 08-088620 | | 4/1996 |

OTHER PUBLICATIONS

Gold et al., "Error Correction Strategy for Data Broadcasting", IEEE, pp. 323–327, 1988.*
Pingzhi et al., "Linear Unequal Error–Protection Array Codes", IEEE, pp. 333–334, Jan. 1988.*
Shiozaki, "Unequal Error–Protection of PCM Signals by Self–Orthogonal Convolutional Codes", IEEE, pp. 289–290, 1980.*
Baker et al., "Mode S System Design and Architecture", IEEE, pp. 1689–1694, 1989.*
Stephen B. Wicker, "Adaptive Rate Error Control Through the Use of Diversity Combining and Majority Logic Decoding in a Hybrid–ARQ Protocol", IEEE, pp. 29.6.1–29.6.6, 1989.*
* cited by examiner

*Primary Examiner*—David Ton
(74) *Attorney, Agent, or Firm*—Sughrue Mion, PLLC

(57) ABSTRACT

An error protection method for multimedia improves data recovery and channel throughput in channels which cause a random error and a burst error by using a rate compatible punctured convolutional code (RCPC) and an automatic retransmission on request (ARQ). In a process of decoding a plurality of packets of given information, the error protection method includes the steps of a) decoding one of the plurality of packets, b) decoding another packet when an error occurs during the decoding in step a), c) decoding a combination of the packets from steps a) and b) or a third packet when an error occurs in step b), and d) repeating step c) until the decoding error no longer occurs. The error protection method has the characteristics of both Type-1 and Type-2 ARQ methods. Therefore, one can obtain constant channel throughput in a channel containing burst errors, a channel containing random errors, and a channel in which the two types of error patterns coexist simultaneously.

17 Claims, 3 Drawing Sheets

ERROR PREVENTION METHOD FOR MULTIMEDIA DATA

Matter enclosed in heavy brackets [ ] appears in the original patent but forms no part of this reissue specification; matter printed in italics indicates the additions made by reissue.

BACKGROUND OF THE INVENTION

The present invention relates to an error prevention method for multimedia, and more particularly, to a method for improving data recovery and channel throughput in channels wherein a random error and a burst error occur by using a rate compatible punctured convolutional code (RCPC) and an automatic retransmission on request (ARQ). Further, this invention has been adopted by the ITUT/SG16/Q11Mobile Group.

Let us consider multimedia terminals which transmit and receive arbitrary packets of data (video, audio, data, or a mixed form of any of those three). The transmitter transmits information packets, for example, I, J, and other packets. For each information packet, the transmitter forms N-sized bitstreams which are different representations of given information packets. For example, the transmitter can generate a packet A (B, C, or D) for given information packet Type-1 and Type-2 are different in that they use different retransmission methods. The packets to be transmitted are formed using either convolutional code or RCPC.

FIG. 1 is a block diagram showing a general situation of data transmitted and received using ARQ. The basic concept of Type-1 ARQ will be described as follows with reference to FIG. 1. When a transmitter transmits a packet A having a length of N, a packet decoder 120 in a receiver starts decoding the received packet A 110. At this time, if errors occur in the packet A and no further decoding is possible, for example, channel coding is not employed, channel coding having a 1-bit error or more is employed or, more errors than a channel coder can detect and correct occur, the receiver asks the transmitter to send the same packet A again. Here, retransmission would be repeated either until the decoder 120 receives an error-free packet A, or for some specific number of iterations to perform transmission and receiving with respect to the next packet. Type-1 ARQ is very effective in burst-error containing channel. Next, Type-2 ARQ will be described. Up to now, there are three types of Type-2 ARQ, i.e., a basic type, a Class A and a Class B, each of which uses RCPC given information I (J,K, . . . ).

FIG. 2 is a conceptual diagram showing the operation of the basic type, wherein arrows represent combination. Here, given information I, the transmitter generates packets A and B using RCPC at a rate of ½ and transmits only the packet A. The decoder in the receiver attempts to decode the packet A. If successful, the decoder then attempts to decode the first packet of two for the next information J. Otherwise, the receiver asks the transmitter to send the packet B. Also, the decoder attempts decoding a combination of packets A and B. If successful, the decoder then attempts to decode the first packet of two for the next information J. Otherwise, the receiver asks the transmitter to send the packet A again and all of these procedures are repeated. The basic type has an advantage in that implementation is not so complicated.

FIG. 3 is a conceptual diagram showing the operation of the Class A packet (Lin-Yu), wherein * denotes self-decoding and arrows represent combination. The operational principle thereof is similar to the basic type except how to combine packets A and B when both packets fail to be decoded. That is, the decoder attempts decoding the combination of packets A and B, and if it fails, the receiver asks the transmitter to send the packet A again. Next, if the decoder succeeds decoding only the packet A, the next information J is processed, and if the decoder fails, the receiver combines the previously stored packet B and currently received packet A (i.e., in general, interleaves the two) to attempt decoding. This method is more effective in a random error containing channel rather than in a burst error containing channel.

Next, Class B is significantly more complicated than the basic type and the Class A. The basic concept thereof is based on the Class A. First, the Class A (Lin-Yu) is performed by generating the packets A and B given the information I using RCPC at a rate of ½. As described above, the Type-1 ARQ is greatly effective in the burst error containing channel. However, with Type-1 ARQ, retransmission would be more frequent in the random error containing channel, which causes drastically lower channel throughput. Even though Type-2 ARQ allows good performance in the random error containing channel, retransmission would be more frequent in the burst error containing channel; therefore, channel throughput can be lowered.

SUMMARY OF THE INVENTION

It is an object of the present invention to provide a method for maintaining channel throughput at a certain level in a random error containing channel and a burst error containing channel by operating like Type-1 in the burst error containing channel, while operating similarly to a basic type or a Class A of Type-2 in the random error containing channel.

To accomplish the above object, there is provided an error prevention method in a method for decoding a plurality of packets of given information, comprising the steps of a) decoding one of the plurality of packets, b) decoding another packet when an error occurs in the decoding in step a), c) decoding a combination of the decoding error packets when an error occurs in step b) or the third packet, and d) repeating step c) until the decoding error no longer occurs.

BRIEF DESCRIPTION OF THE DRAWINGS

The above object and advantage of the present invention will become more apparent by describing in detail a preferred embodiment thereof with reference to the attached drawings in which.

DETAILED DESCRIPTION OF THE INVENTION

The present invention is a method for performing a hybrid-type ARQ which mixes Type-1 and Type-2 methods.

Figure 1:
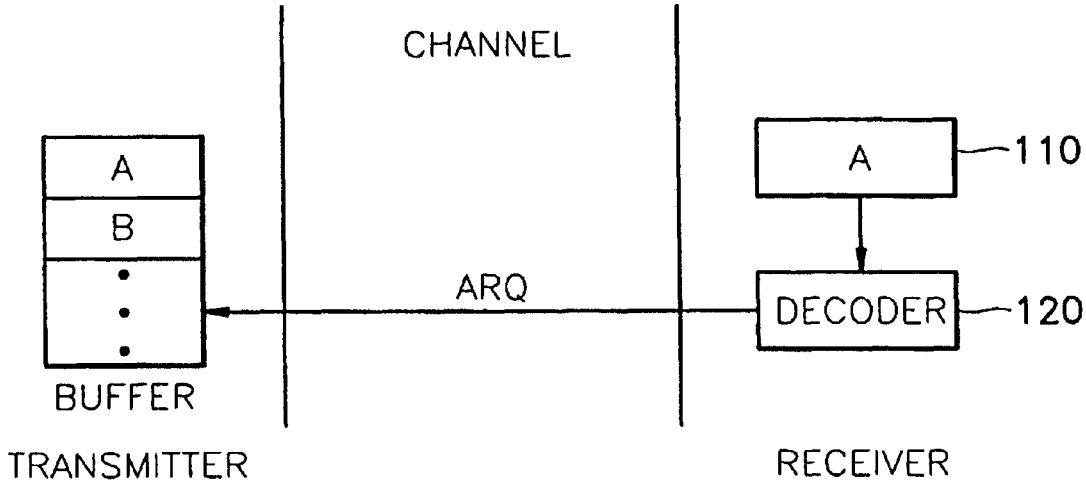
FIG. 1 (PRIOR ART)
FIG. 1 is a block diagram showing the general situation of data transmission and reception using an ARQ method.
Figure 2:
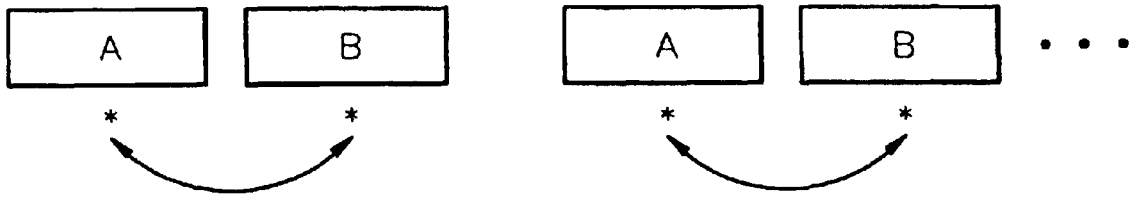
FIG. 2 (PRIOR ART)
FIG. 2 is a conceptual diagram showing the operation of a basic type.
Figure 3:
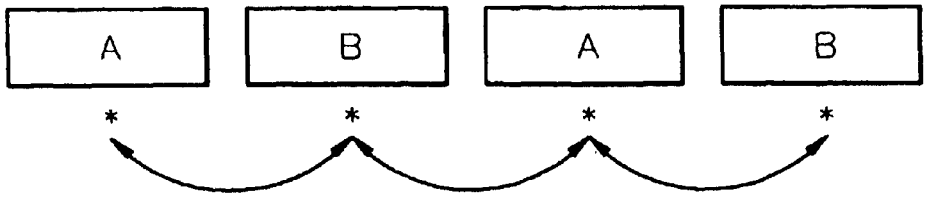
FIG. 3 (PRIOR ART)
FIG. 3 is a conceptual diagram showing the operation of a Class A.
Figure 4:
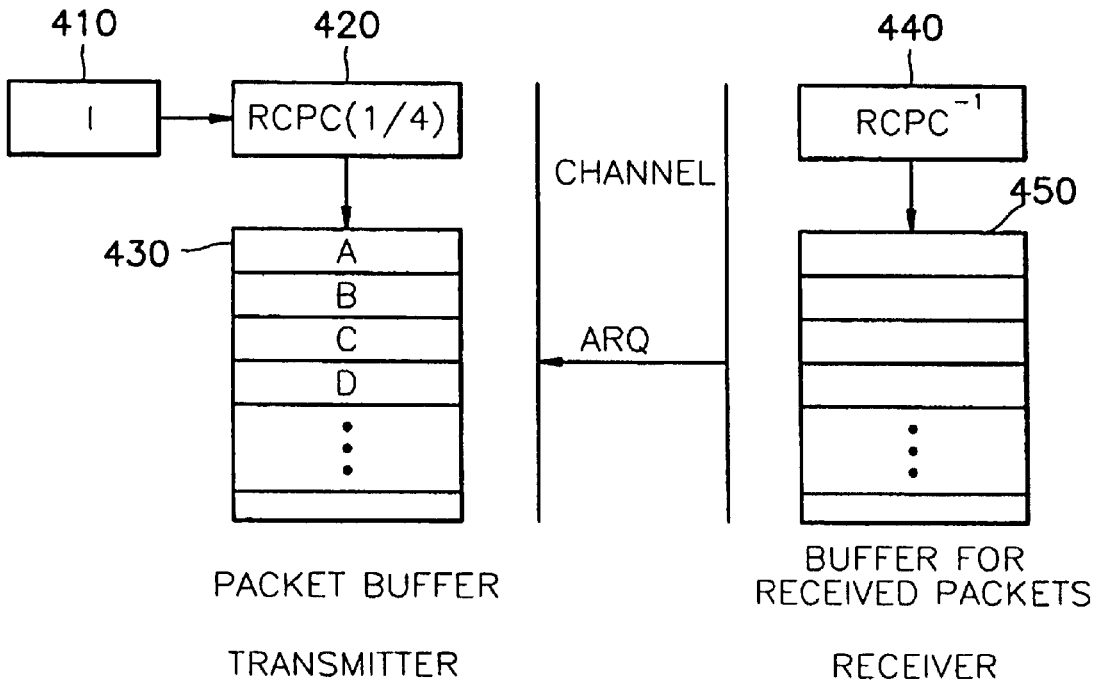
FIG. 4 is a block diagram showing the structure of an apparatus for realizing error prevention according to the present invention.

Referring to FIG. 4, an error prevention apparatus includes: a transmitter provided with a packet buffer 430 for producing packets A, B, C and D using an RCPC 420 having a rate of ¼ for given information packet I 410; an inverse RCPC 440; and a receiver provided with a buffer 450 for storing the received packet, for sending an ARQ and a packet number to the transmitter via a channel. In FIG. 4, an RCPC logic is fixed at a rate of ¼. A portion comprised of four arbitrary polynomials which satisfies a locally invertible characteristic simultaneously produces RCPC-processed packets A, B, C and D. Also, the transmitter has a maximum of four retransmissions. Here, the local inversion in the RCPC denotes that original information I can be obtained with any one of the packets A and B and with a combination of the packets A and B.

Figure 5:
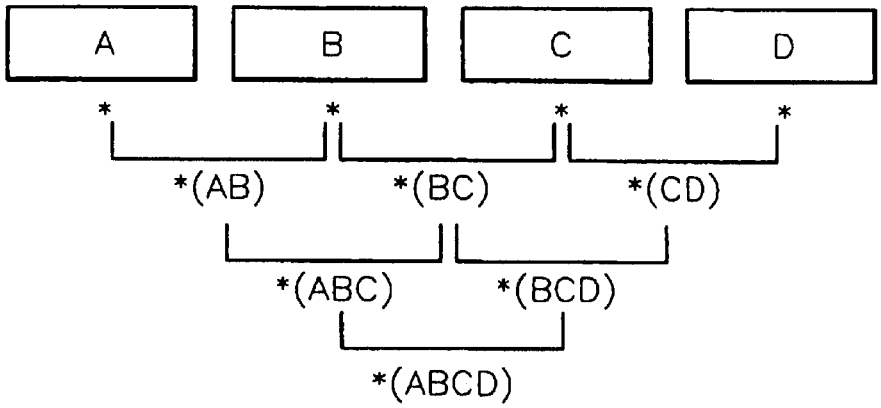
FIG. 5 is a conceptual diagram showing a procedure for processing of received packets A, B, C and D in a decoder of a receiver shown in FIG. 4.

FIG. 5 is a conceptual view showing a procedure for processing the received packets A, B, C and D in the decoder of the receiver shown in FIG. 4, wherein * indicates self-decoding and a bracket indicates a combination of packets (generally, an interleaving operation).

Figure 6:
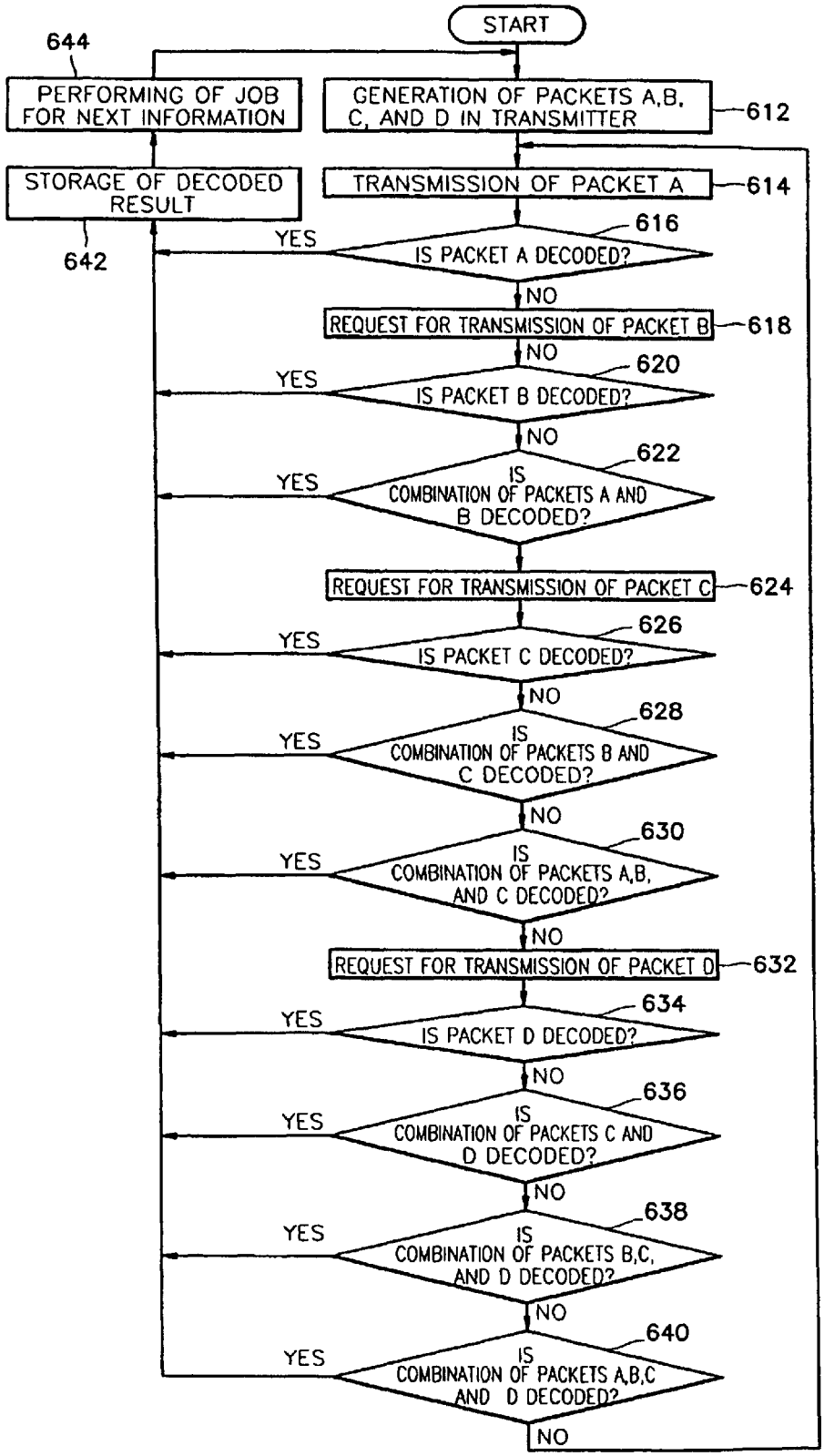
FIG. 6 is a flow chart showing a procedure for processing received packets in a decoder according to the present invention.

FIG. 6 is a flow chart outlining a procedure for processing the received packets in a decoder according to the present invention.

As shown in FIG. 6, the transmitter produces packets A, B, C and D using the RCPC 420 in step 612. The first packet A is transmitted to the receiver in step 614. The decoder attempts decoding the packet A in step 616. In step 616, if the packet A is decoded, the decoded results are stored in the buffer 450 (step 642) and the job for other information (e.g., information J) proceeds (step 644), otherwise, an ARQ signal is sent to the transmitter to request transmission of the packet B (step 618). The decoder attempts decoding only the packet B in step 620. If successful, the decoded results are stored in the buffer 450 in step 642 and the job for other information (e.g., information J) proceeds in step 644. If the decoder fails, it then attempts to decode the combination of the packets A and B in step 622, which is indicated by * AB in FIG. 5. At this time, if the combination of the packets A and B as shown in FIG. 5 are decoded, the decoded results are stored in the buffer 450 (step 642) and the job for other information (e.g., information J) proceeds (step 644). If the combination of the packets A and B is not decoded, the transmitter is requested to transmit the packet C by sending the ARQ signal thereto in step 624. The decoder then attempts decoding only packet C in step 626. If successful, the decoded results are stored in the buffer 450 in step 642 and the job for other information (e.g., information J) proceeds in step 644. Otherwise, the decoder attempts to decode the combination of the packets B and C in step 628, which is indicated by *BC in FIG. 5. If the combination of the packets B and C is successfully decoded, the decoded results are stored in the buffer 450 (step 642) and the job for other information (e.g., information a) proceeds (step 644). If the combination thereof is not decoded, the combination of packets B and C is combined with packet A as shown in FIG. 5 as * ABC and decoding is attempted in step 630. Here, if the combination of packets A, B and C is decoded, the decoded results are stored in the buffer 450 (step 642) and the job for other information (e.g., information J) proceeds (step 644). Otherwise, the transmitter is requested to transmit the packet D by sending the ARQ signal thereto in step 632. The decoder then attempts decoding only the packet D in step 634. If successful, the decoded results are stored in the buffer 450 in step 642 and the job for other information (e.g., information J) proceeds in step 644. Otherwise, the decoder attempts to decode the combination of packets C and D in step 636, which is indicated by *CD in FIG. S. If the combination of packets C and D is decoded, the receiver stores the decoded results in the buffer 450 (step 642) and performs the job for other information (e.g., information J) (step 644). Otherwise, the receiver combines packets C and D with packet B as indicated by *BCD in FIG. 5 and attempts decoding the combination in step 638. Here, if the combination of packets B, C and D is decoded, the decoded results are stored in the buffer 450 (step 642) and the job for other information (e.g., information J) proceeds (step 644). otherwise, the receiver combines packets B, C and D with packet A as indicated by *ABCD in FIG. 5 and attempts decoding combination in step 640. If the combination of packets A, B, C and D is decoded, the receiver stores the decoded results in the buffer 450 (step 642) and performs the job for other information (e.g., information J) (step 644). Otherwise, the process returns to step 614 to repeat all of these procedures until no errors occur. Meanwhile, the receiver stores the decoded results in the buffer 450 in step 642 and performs the job for the next information (e.g., information J, K, . . . ) in step 644.

As described above, the present invention has the characteristics of both Type-1 and Type-2 ARQ methods; therefore, one can obtain constant channel throughput in the burst error containing channel, the random error containing channel, and a channel where the two error patterns coexist simultaneously. In the burst error containing channel, the method of the present invention is performed nearly the same as or better than the Type-1 method and much better than the Type-2 method. As for the random error containing channel, since the method of the present invention is performed similar to the Type-2 method, it also performs almost the same as the Type-2 method, but much better than the Type-1 method.

What is claimed is:

1. A method of protecting error from occurring during decoding of a plurality of packets of given information, comprising the steps of:

a) decoding one of said plurality of packets;

b) decoding another packet when an error occurs during said decoding in said step a);

c) decoding a combination of said packets of said steps a) and b) or a third packet when an error occurs during said decoding in said step b), and d) repeating said step c) unit no decoding error occurs.

2. An error protecting method as claimed in claim 1, further comprising the step of, storing the decoded results and standing by decoding of a plurality of packets of next information when no decoding error occurs during said steps a) to d).

3. An error protecting method as claimed in claim 1, wherein, at least two decoding error packets are combined and decoded when the number of said packets in said step c) is at least three.

4. An error protection method as claimed in claim 3, wherein decoding is sequentially performed starting from when the number of combined packets is two and including a latest packet determined to have a decoding error.

5. A method of protecting from an error occurring during the decoding of a plurality of packets of given information, comprising:

a) decoding a first packet which is one of the plurality of packets; and b) combining the first packet with two or more other packets of the plurality of packets when an error occurs in the decoding in a), wherein said two or more other packets are packets which had an error occur during decoding thereof.

6. A method of protecting from an error occurring during the decoding of a plurality of packets of given information, comprising:

a) decoding a first packet which is one of the plurality of packets;

b) combining the first packet with a second packet when an error occurs in the decoding in a), wherein said second packet is one of the plurality of packets and is a packet which had an error occur during decoding thereof;

c) combining the first packet with a combination of the second packet and at least a third packet and decoding the packets combined in c), when an error occurs in the decoding in b), wherein said third packet is one of the plurality of packets and is a packet which had an error occur during decoding thereof; and d) repeating c) if an error occurs in the decoding of c).

7. An error protection method as claimed in claim 6, further comprising storing one of the decoded results and standing by the stored decoded result when no decoding error occurs in any one of a) to c).

8. A method of protecting errors during decoding of a plurality of packets of given information, comprising:

a) decoding a first packet of said plurality of packets;

b) decoding a second packet of said plurality of packets when an error occurs during the decoding of said first packet;

c) decoding a combination of said first and second packets when an error occurs, during decoding of the second packet; and d) decoding a third packet of said plurality of packets when an error occurs during the decoding of said first and second packets, and when an error occurs in decoding said combination of said first and second packets.

9. An error protection method as claimed in claim 8, further comprising:

e) decoding a combination of two or more of said first through third packets when an error occurs during the decoding in step d).

10. An error protection method as claimed in claim 9, further comprising:

f) if an error occurs e), repeating step e) using a different combination of packets.

11. An error protection apparatus for protecting errors from occurring during decoding of a plurality of packets of given information, comprising:

a buffer coupled to a transmission channel and storing packets received from a transmitter;

a decoder unit which decodes one or more packets stored in the buffer, wherein in response to generating an error upon decoding a combination of the packets, said decoder unit decodes a second combination of packets stored in said buffer, wherein said second combination of packets is different from said first combination of packets.

12. The error protection apparatus as claimed in claim 11, wherein in response to said decoder unit generating a decoding error, said buffer transmits a signal to the transmitter causing the transmitter to transmit another of the plurality of packets.

13. An error protection apparatus for protecting errors from occurring during decoding of a plurality of packets of given information, comprising:

a buffer coupled to a transmission channel and storing packets received from a transmitter;

decoder means for decoding one or more packets stored in the buffer, wherein in response to generating an error upon decoding a combination of the packets, said decoder means decodes a second combination of packets stored in said buffer, wherein said second combination of packets is different from said first combination of packets.

14. The error protection apparatus as claimed in claim 13, wherein in response to said decoder means generating a decoding error, said buffer transmits a signal to the transmitter causing the transmitter to transmit another of the plurality of packets.

*15. A method of protecting errors from occurring during decoding of a plurality of packets of given information, comprising the steps of:*

*(a) decoding one of said plurality of packets;*

*(b) decoding another packet when an error occurs during said decoding in said step (a); and*

*(c) decoding a combination of said packets of said steps (a) and (b) or a third packet when an error occurs during said decoding in said step (b).*

*16. A method of protecting from an error occurring during the decoding of a plurality of packets of given information, comprising:*

*(a) decoding a first packet which is one of the plurality of packets; and*

*(b) combining the first packet with two or more other packets of the plurality of packets when an error occurs in the decoding in (a).*

*17. An error protection apparatus for protecting errors from occurring during decoding of a plurality of packets of given information, comprising:*

*a buffer coupled to a transmission channel and storing packets received from a transmitter; and*

*a decoder unit which decodes one or more packets stored in the buffer, wherein in response to generating an error upon decoding a combination of the packets, said decoder unit decodes a second combination of packets stored in said buffer.*

* * * * *